United States Patent
Kang et al.

(10) Patent No.: US 9,012,985 B2
(45) Date of Patent: Apr. 21, 2015

(54) SEMICONDUCTOR DEVICE HAVING A TRENCH WHOSE UPPER WIDTH IS WIDER THAN A LOWER WIDTH THEREOF, AND A METHOD FOR FABRICATING THE SAME

(71) Applicant: MagnaChip Semiconductor, Ltd., Cheongju-si (KR)

(72) Inventors: SooChang Kang, Seoul (KR); YoungJae Kim, Incheon (KR)

(73) Assignee: MagnaChip Semiconductor, Ltd., Cheongju-si (KR)

(*) Notice: Subject to any disclaimer, the term of this patent is extended or adjusted under 35 U.S.C. 154(b) by 0 days.

(21) Appl. No.: 14/080,884

(22) Filed: Nov. 15, 2013

(65) Prior Publication Data
US 2014/0252462 A1    Sep. 11, 2014

(30) Foreign Application Priority Data
Mar. 5, 2013    (KR) ......................... 10-2013-0023548

(51) Int. Cl.
| | |
|---|---|
| *H01L 29/00* | (2006.01) |
| *H01L 29/78* | (2006.01) |
| *H01L 29/423* | (2006.01) |
| *H01L 29/417* | (2006.01) |
| *H01L 29/66* | (2006.01) |

(52) U.S. Cl.
CPC ........ *H01L 29/7827* (2013.01); *H01L 29/4236* (2013.01); *H01L 29/41766* (2013.01); *H01L 29/66734* (2013.01); *H01L 29/66666* (2013.01); *H01L 29/66787* (2013.01)

(58) Field of Classification Search
CPC .................. H01L 29/66734; H01L 29/41766; H01L 29/4236
See application file for complete search history.

(56) References Cited

U.S. PATENT DOCUMENTS

| | | | | |
|---|---|---|---|---|
| 2010/0264486 A1* | 10/2010 | Denison et al. | ............... | 257/330 |
| 2012/0098057 A1* | 4/2012 | Kim et al. | ...................... | 257/330 |
| 2012/0313178 A1* | 12/2012 | Liao et al. | ..................... | 257/368 |
| 2013/0153992 A1* | 6/2013 | Loechelt | ....................... | 257/330 |
| 2014/0015039 A1* | 1/2014 | Hossain | ........................ | 257/330 |
| 2014/0054683 A1* | 2/2014 | Chuang et al. | ................ | 257/330 |
| 2014/0252461 A1* | 9/2014 | Kang et al. | ..................... | 257/330 |
| 2014/0252462 A1* | 9/2014 | Kang et al. | ..................... | 257/330 |
| 2014/0264523 A1* | 9/2014 | Loechelt et al. | .............. | 257/301 |
| 2014/0374824 A1* | 12/2014 | Calafut et al. | ................ | 257/334 |

* cited by examiner

*Primary Examiner* — Ngan Ngo
(74) *Attorney, Agent, or Firm* — NSIP Law

(57) ABSTRACT

A semiconductor device and a fabricating method thereof are provided. The semiconductor device includes: a trench disposed within a substrate, the trench comprising an upper trench part that is wider than a lower trench part in width; a gate disposed in the trench; an interlayer insulating layer pattern disposed above the gate in the upper trench part; a source region disposed within the substrate and contacting a sidewall of the upper trench part; a body region disposed below the source region in the substrate; and a contact trench disposed above the body region and filled with a conductive material.

13 Claims, 12 Drawing Sheets

SEMICONDUCTOR DEVICE HAVING A TRENCH WHOSE UPPER WIDTH IS WIDER THAN A LOWER WIDTH THEREOF, AND A METHOD FOR FABRICATING THE SAME

CROSS-REFERENCE TO RELATED APPLICATION

This application claims the benefit under 35 U.S.C. §119 (a) of Korean Patent Application No. 10-2013-0023548, filed on Mar. 5, 2013, in the Korean Intellectual Property Office, the entire disclose of which is incorporated herein by reference for all purposes.

BACKGROUND

1. Field

The following description relates to a semiconductor device, and to, for example, a semiconductor device having a trench whose upper width is wider than a lower width thereof, and a method for fabricating the same.

2. Description of Related Art

Metal oxide semiconductor field effect transistor (MOSFET) is a type of semiconductor device that is well known in the semiconductor industry. One type of MOSFET is a vertically-conducting trench MOSFET.

Figure 1:
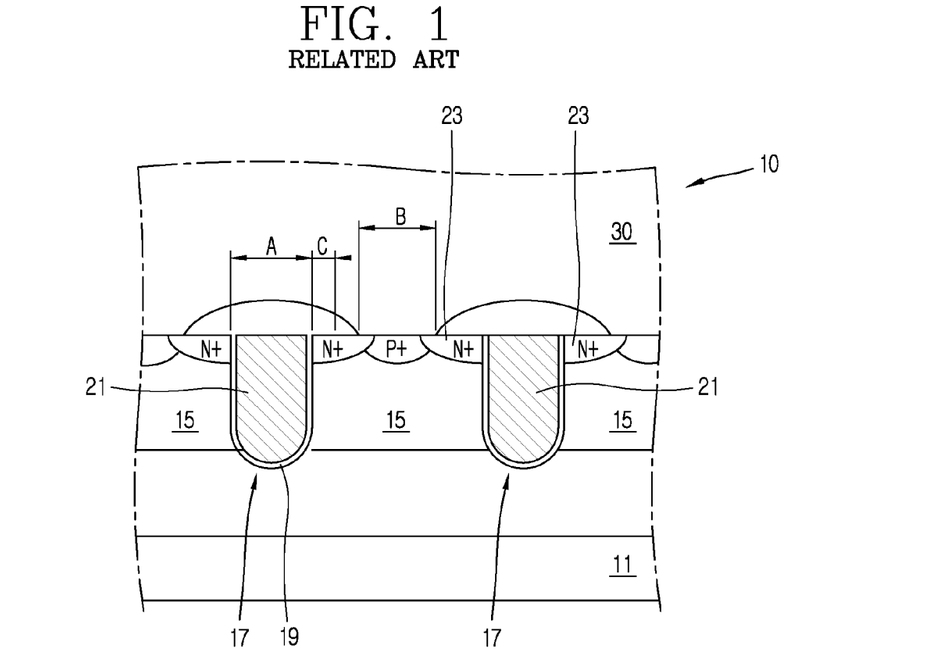
FIG. 1 is a schematic diagram illustrating a sectional view of a MOSFET that uses a trench.

FIG. 1 is a sectional view schematically illustrating a MOSFET.

Referring to FIG. 1, a MOSFET 10 includes trenches 17. The trenches 17 each include a polysilicon gate 21 that is insulated from a body region 15 by a gate insulating layer 19. A source region 23 contacts a side surface of each trench 17. The gate insulating layer 19 insulates the gate 21 from a metal layer 30. A semiconductor substrate 11 forms a drain of the MOSFET 10.

Still referring to FIG. 1, a reference numeral A denotes a trench width, B denotes a contact opening, and C denotes a gap between the trench and the contact opening. When the MOSFET 10 is biased in an ON state, a current vertically flows between the source region 23 and the semiconductor substrate 11.

In the ON state, a current capability of the MOSFET 10 is in reverse proportion to ON resistance $Rds_{on}$ between drain and source. Hence, to improve the current capability of the MOSFET 10, the ON resistance $Rds_{on}$ has to be lowered.

One method of lowering the ON resistance of the MOSFET 10 is to increase density of the trench 17, namely, the number of trenches per unit area. This is achieved by reducing a cell pitch. However, the degree to which the cell pitch of the MOSFET may be reduced is limited by certain features included in the MOSFET cell and the processes used for fabricating the MOSFET.

In a MOSFET, a source region is generally formed on a semiconductor substrate in a horizontal direction from a trench to lower the ON resistance. This increases the density of the MOSFET cell per unit area.

In order to lower the ON resistance of the MOSFET, the number of trenches per unit area has to be increased. However, a process of setting a gap between the trench and the contact opening on a surface is required in order to form the source region on the semiconductor substrate in the horizontal direction from the trench. Consequently, there is a limit to the degree to which the trench gap may be reduced, and this further limits the degree to which the ON resistance of the MOSFET may be lowered.

SUMMARY

In one general aspect, there is provided a semiconductor device including: a trench disposed within an epitaxial layer of a substrate, the trench having an upper trench part that is wider than a lower trench part in width; a gate insulating layer disposed on an inner surface of the trench; a gate disposed within the trench; an interlayer insulating layer pattern disposed on the gate insulating layer within the trench including the gate; a source region disposed within the substrate and contacting a sidewall of the upper trench part of the trench; a body region disposed within the epitaxial layer of the substrate; a contact trench filled with a metal, the contact trench allowing the source region and the body region to contact each other; and a highly doped impurity region formed beneath the contact trench, the highly doped impurity region having the same type of impurity as the body region and having a higher concentration of impurity than the body region.

A lower surface of the source region may be formed lower than a lower surface of the contact trench.

An upper surface of the gate may be flush with or higher than the lower is surface of the contact trench.

A depth from an upper surface of the substrate to a lower surface of the contact trench may be a half of a depth from the upper surface of the substrate to the lower surface of the lower trench part.

An upper surface of the gate may be flush with or lower than a lower surface of the contact trench.

The interlayer insulating layer may include a BPSG film, HLD oxide or a combination thereof.

In another general aspect, there is provided a method for fabricating a semiconductor device involving: forming a lower trench part within an epitaxial layer of a substrate; forming a first oxide layer on a surface of the lower trench part; forming a sacrificed buried layer pattern on the first oxide layer within the lower trench part; removing an exposed portion of the first oxide layer to expose a sidewall of the lower trench part; forming a second oxide layer on the sidewall of the lower trench part and a surface of the sacrificed buried layer pattern; removing the second oxide layer, the sacrificed buried layer pattern and the first oxide layer so as to form an upper trench part on the sidewall of the lower trench part, the upper trench part having a width wider than that of the lower trench part; forming a gate insulating layer on surfaces of the lower trench part, the upper trench part and the substrate; filling the trench by depositing polysilicon on the gate insulating layer within the lower trench part and the upper trench part; forming a body region within the epitaxial layer; forming a gate within the lower trench part by etching the polysilicon; forming a source region through ion injection into a sidewall of the upper trench part; forming an interlayer insulating layer pattern on the gate insulating layer within the upper trench part; forming a contact trench to contact the source region and the body region; forming a highly-doped impurity region on the contact trench, the highly-doped impurity region having the same type of impurity as the body region and having a higher concentration of impurity than the body region; and filling the contact trench with a metal layer.

The contact trench may be formed using a self align contact etching method.

The interlayer insulating layer may include a BPSG film, HLD oxide or a combination thereof.

The sacrificed buried layer pattern may be made of polysilicon or an interlayer insulating material.

The gate may be formed by etching back the polysilicon.

In another general aspect, there is provided a method fabricating a semiconductor device involving: forming a lower trench part within a substrate including an epitaxial layer; forming a first oxide layer on a surface of the lower trench part; depositing polysilicon on the first oxide layer within the lower trench part; forming a body region within the epitaxial layer; forming a gate within the lower trench part and partially exposing the first oxide layer; removing the exposed portion of the first oxide layer to expose a sidewall of the lower trench part; forming a second oxide layer on the gate and a sidewall of the lower trench part so as to form an upper trench part, the upper trench part having a width wider than that of the lower trench part; forming an insulating layer on the gate including the upper trench part; forming an interlayer insulating layer pattern on the insulating layer within the upper trench part; forming a contact trench to contact the body region; forming a highly doped impurity region beneath the contact trench, the highly doped impurity region having the same type of impurity as the body region and having a higher concentration of impurity than the body region; and filling the contact trench with a metal layer.

The contact trench may be formed using a self align contact etching method.

The interlayer insulating layer may include a BPSG film, HLD oxide or a combination thereof.

The gate may be formed by etching back the polysilicon.

The general aspect of the method may further include forming a source region through ion injection before removing the first oxide layer after forming the gate.

The general aspect of the method may further include forming a source region through ion injection after forming the second oxide layer on a sidewall of the upper trench part.

The general aspect of the method may further include forming a source region through ion injection after removing the second oxide layer.

The contact trench may be formed to contact the source region.

In another general aspect, there is provided a semiconductor device including: a trench disposed within a substrate, the trench comprising an upper trench part that is wider than a lower trench part in width; a gate disposed in the trench; an interlayer insulating layer pattern disposed above the gate in the upper to trench part; a source region disposed within the substrate and contacting a sidewall of the upper trench part; a body region disposed below the source region in the substrate; and a contact trench disposed above the body region and filled with a conductive material.

The general aspect of the semiconductor device may further include an impurity region disposed beneath the contact trench, the impurity region having the same type of impurity as the body region and having a higher concentration of impurity than the body region.

Other features and aspects may be apparent from the following detailed description, the drawings, and the claims.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. Also, descriptions of well-known functions and constructions may be omitted for increased clarity and conciseness.

Figure 2:
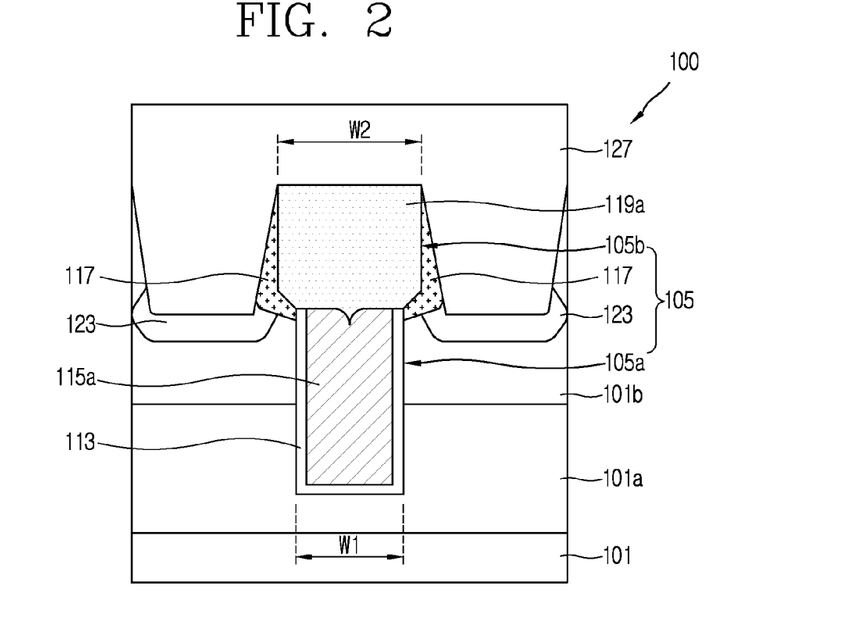
FIG. 2 is a schematic diagram illustrating a sectional view of an example of a semiconductor device according to the present disclosure.

FIG. 2 is a sectional view illustrating an example of a semiconductor device according to the present disclosure.

Referring to FIG. 2, an example of a semiconductor device according to the present disclosure may include a trench 105 formed within a semiconductor substrate 101 having an epitaxial layer 101a and having an upper trench part 105b whose width W2 is wider than a width W1 of a lower trench part 105a; a gate insulating layer 113 formed on an inner surface of the epitaxial layer 101a of the trench 105; a gate 115a formed on the gate insulating layer 113 within the trench 105; a source region 117 formed within the epitaxial layer 101a of the semiconductor substrate 101 and contacting an upper side wall of the trench 105; an interlayer insulating layer 119a formed on the gate insulating layer 113 within the trench 105 including the gate 115a; a body region 101b formed within the epitaxial layer 101a of the semiconductor substrate 101; a highly doped P-type region 123 formed within a surface of the body region 101b; and a metal layer 127 formed to contact the body region 101b and the source region 117 with each other.

In this example, the gate insulating layer 113 may be implemented as a silicon oxide layer and may have a thickness of approximately 300 to 1000 Å.

The gate 115a may be made of polysilicon and formed within the lower trench part 105a. The gate 115a may be approximately 5000 to 10000 Å thick. The polysilicon of the gate 115a may be doped with impurities.

The source region 117 may be formed within the semiconductor substrate 101, and may contact the upper trench part 105b. The source region 117 may be formed by injecting N-type impurity such as arsenic or phosphorous along a region of the semiconductor substrate that contacts the upper trench part 105b. That is, the source region 117 may be formed within the semiconductor substrate 101 corresponding to the upper trench part 105b. In this example, the semiconductor substrate 101 may be used as a drain region.

In addition, the interlayer insulating layer 119a may be made of an insulating material such as BPSG film, HLD oxide or a combination thereof, and may have a thickness of approximately 4000 to 15000 Å.

Meanwhile, the P-type body region 101b may be formed within the semiconductor substrate 101 outside the trench 105. For instance, the P-type body region 101b may be formed within an epitaxial layer of the semiconductor substrate 101 between adjacent trenches 105 by way of injecting P-type impurities such as boron.

The highly doped P-type region 123 may allow for an Ohmic contact between the metal layer 127 and the body region 101b.

The metal layer 127 may be insulated from the gate 115a by the interlayer to insulating layer pattern 119a that extends from an upper surface of each trench and fills the upper trench part 105b.

As aforementioned, in the semiconductor device 100 according to the present disclosure, the width W2 of the upper trench part 105b may be wider than the width W1 of the lower trench part 105a. This may ensure a gap between the is trench and a contact opening, allowing for forming the source region on the lower end of the upper trench.

For example, with the width W2 of the upper trench part being wider than the width W1 of the lower trench part 105a, the semiconductor device may ensure the source region 117 within the semiconductor substrate that contacts the upper trench part 105b. This may minimize a cell pitch (a trench-trench width) so as to increase cell density. Consequently, an ON resistance value $Rds_{on}$ as one of main features of the semiconductor device using the trench can be lowered.

Hereinafter, description will be given of a method for fabricating the semiconductor device with the configuration, with reference to FIGS. 3A to 3N.

Figure 3A:
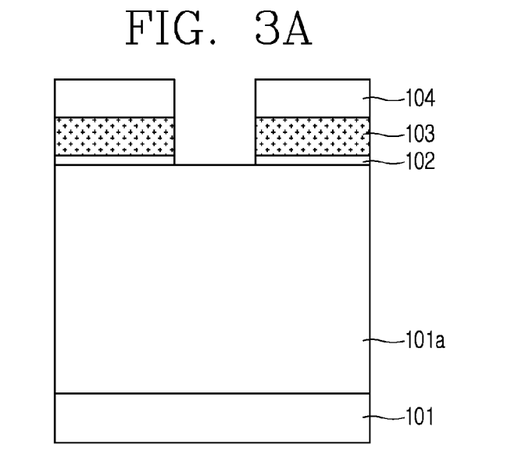
FIGS. 3A to 3N are diagrams of sectional views of a semiconductor device during its fabrication for sequentially illustrating an example of a method for fabricating the semiconductor device.
Figure 3B:
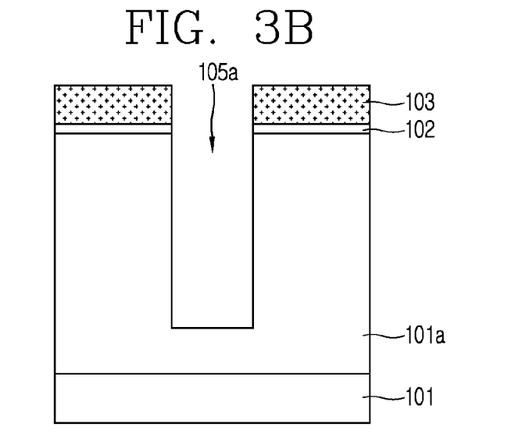
Figure 3C:
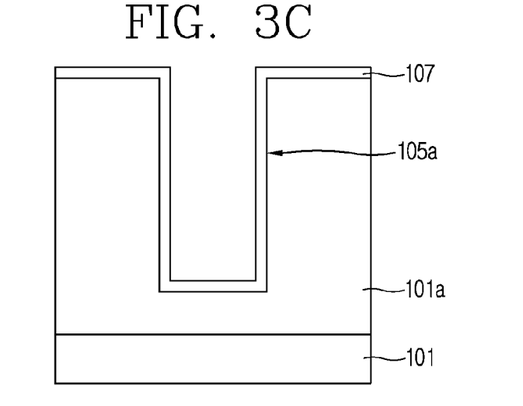
Figure 3D:
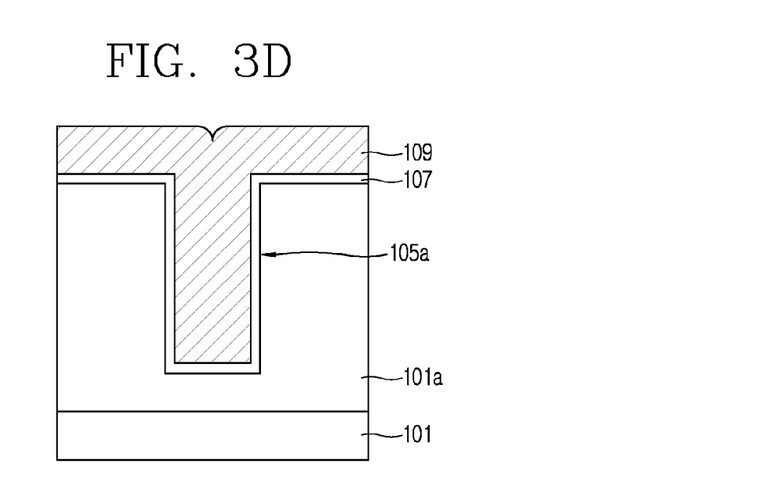
Figure 3E:
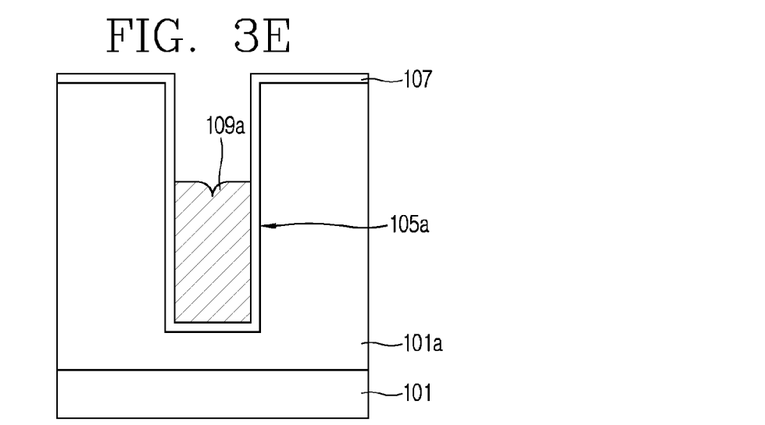
Figure 3F:
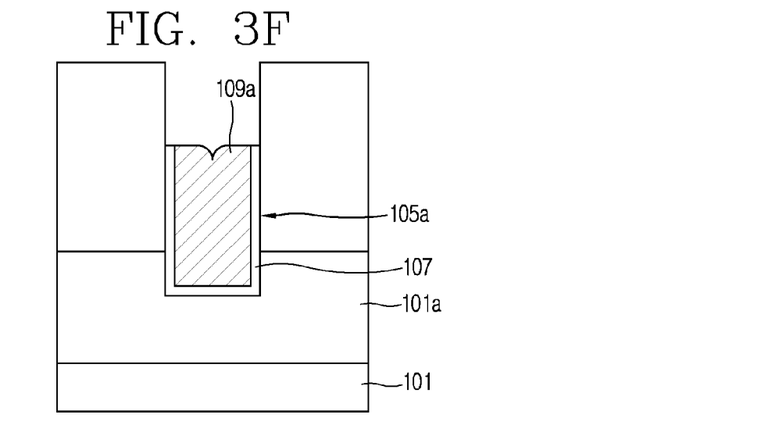
Figure 3G:
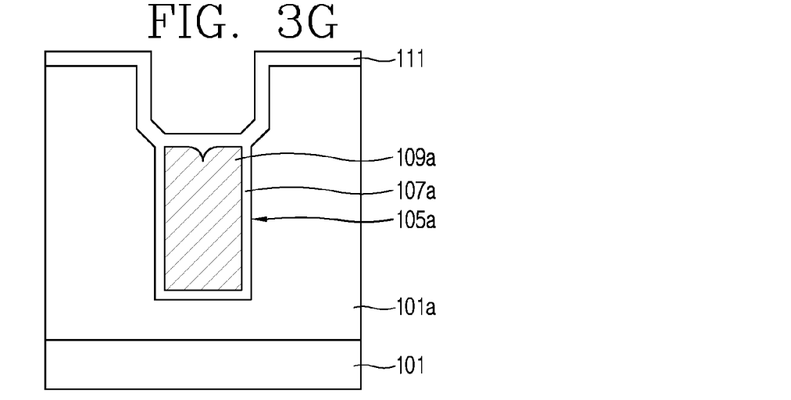
Figure 3H:
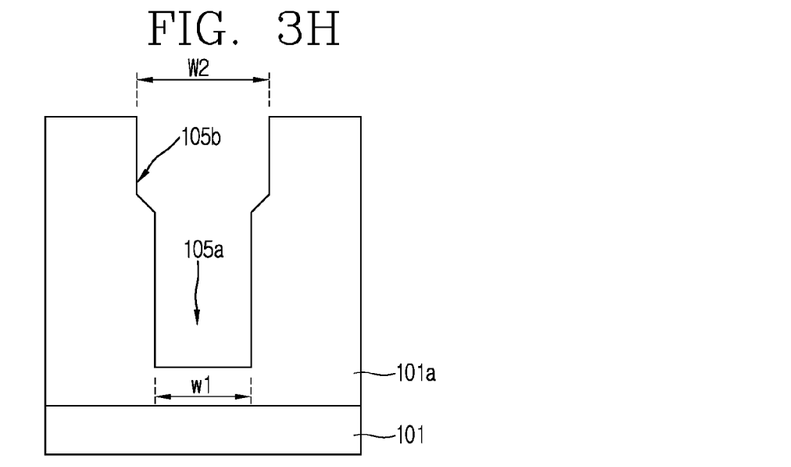
Figure 3I:
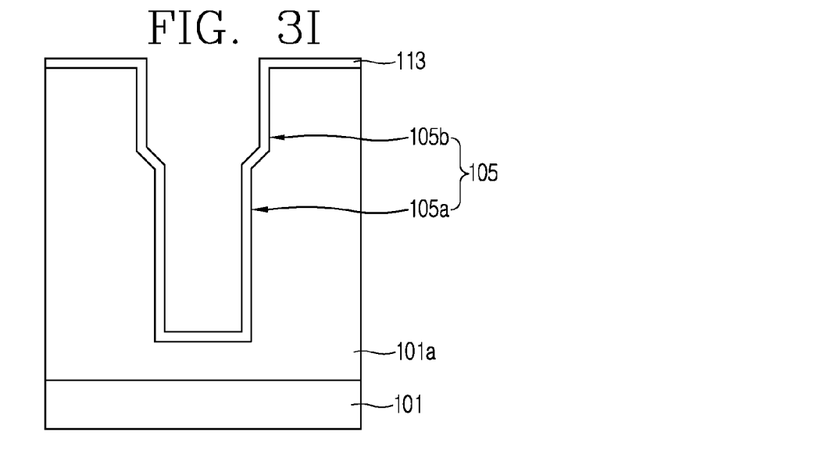
Figure 3J:
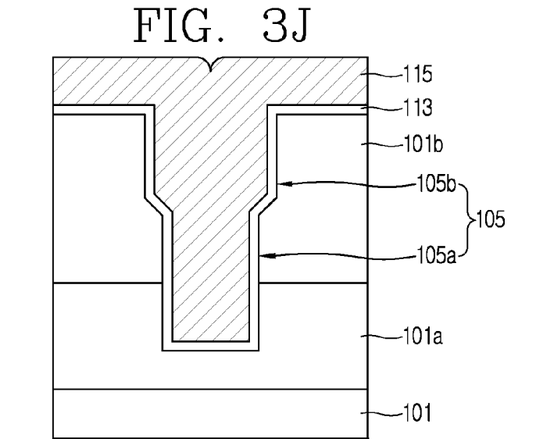
Figure 3K:
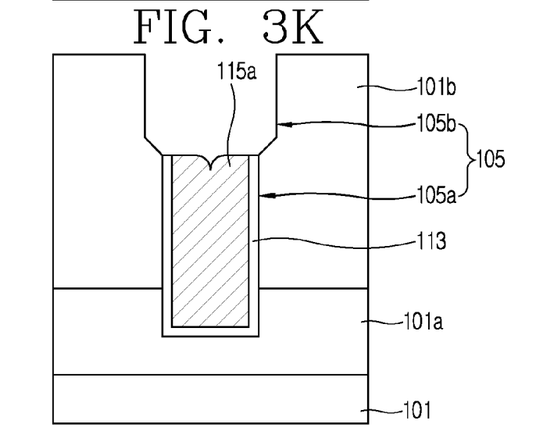
Figure 3L:
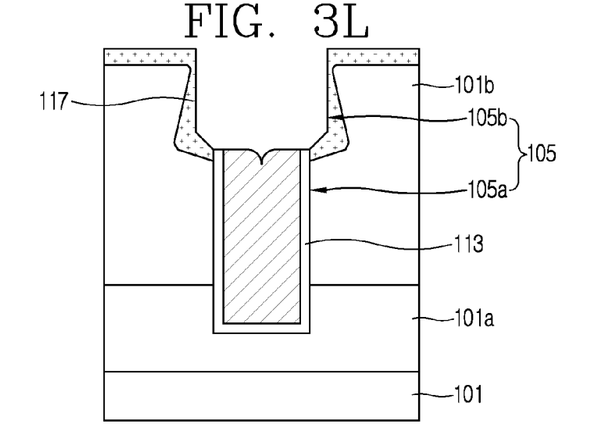
Figure 3M:
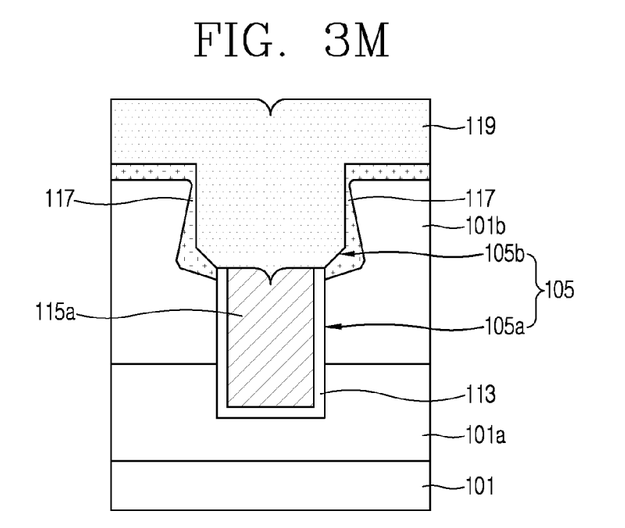
Figure 3N:
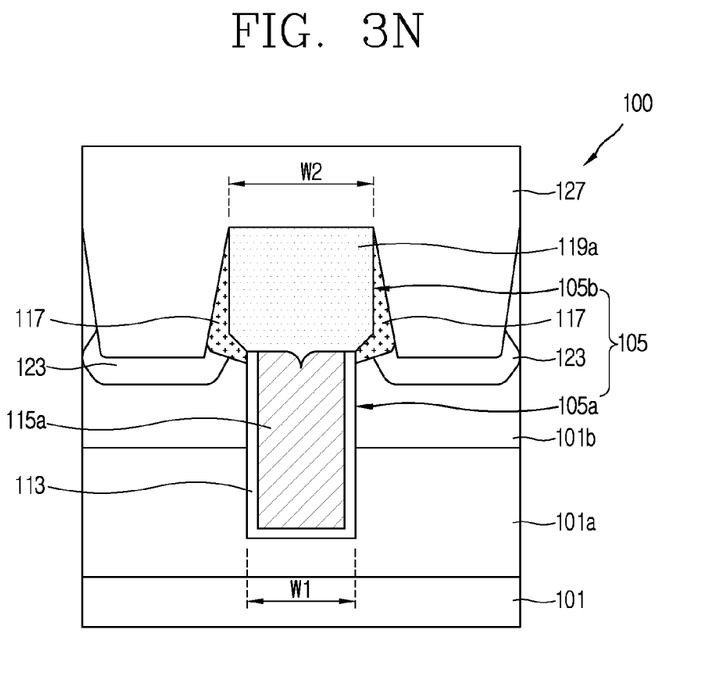

FIGS. 3A to 3N illustrate sectional views of a semiconductor device during its fabrication to sequentially illustrate an example of a method for fabricating such a semiconductor device.

As shown in FIG. 3A, a lightly doped N-type epitaxial layer 101a may be disposed on a highly doped N-type semiconductor substrate 101.

Although not shown, a pad oxide layer (not shown) and a pad silicon nitride layer (not shown) may be sequentially deposited on the semiconductor substrate 101 that is defined by an inactive layer region and an active region. For instance, the pad oxide layer (not shown) and the pad silicon nitride layer (not shown) may be used as a hard mask material layer. Also, a thickness of the hard to mask material layer may be much thinner than a depth of a deep trench.

Next, although not shown, a first photosensitive layer (not shown) may be coated on the pad silicon nitride layer (not shown).

The first photosensitive layer (not shown) may be exposed and developed through a photolithography process using an exposure mask (not shown), and the is developed portion may be removed, thereby forming a photosensitive layer pattern 104.

Still referring to FIG. 3A, the pad silicon nitride layer and the pad oxide layer that construct the hard mask may be etched using the photosensitive layer pattern 104 as a mask, to form a pad silicon nitride pattern 103 and an oxide layer pattern 102. And, the first photosensitive layer pattern 104 may then be removed. Here, the etching is performed into the pad silicon nitride layer 103 and the pad oxide layer 102 to prevent a defective coating of the photosensitive layer, which may be caused when executing the etching to form a shallow trench, namely, an upper trench part. That is, the use of the pad silicon nitride layer 103 and the pad oxide layer 102 may facilitate a process of defining a shallow trench forming region, namely, an upper trench part forming region by employing a hard mask etching process. Then, the shallow trench is formed by using the pad silicon nitride pattern 103 of the hard mask.

Referring to FIG. 3B, the pad silicon nitride layer pattern 103 and the pad oxide layer pattern 102 that construct the hard mask may be used as an etching mask to etch an exposed portion of the epitaxial layer 101a of the semiconductor substrate 101 located beneath those patterns, thereby forming a lower trench part 105a corresponding to the deep trench.

Next, referring to FIG. 3C, the pad nitride layer pattern 103 and the pad to oxide layer pattern 102 may be removed. Thereafter, the surface of the epitaxial layer 101a of the semiconductor substrate 101 including the lower trench part 105a may be oxidized to form a first oxide layer 107. In this process, instead of the first oxide layer 107, a sidewall nitride layer may be formed using a nitride layer. In the event that the nitride layer is used, a sidewall oxide layer may be formed to is reduce stress between the semiconductor substrate and a nitride layer material prior to forming the nitride layer. The first oxide layer 107 may be grown in a thermal oxidation manner.

The thickness of the first oxide layer 107 may change depending on the duration of time used for executing the oxidation. That is, the thickness of the first oxide layer 107 may be appropriately controlled by adjusting an oxidation time.

Referring to FIG. 3D, polysilicon or an interlayer insulating material may be deposited on the first oxide layer 107 that is located on the epitaxial layer 101a of the semiconductor substrate 101 including the lower trench part 105a, forming a sacrificed buried layer 109. In this example, the sacrificed buried layer 109 may be formed with sufficient thickness to bury and to fill up an inside of the lower trench part 105a.

Referring to FIG. 3E, the sacrificed buried layer 109 may be etched back to form a sacrificed buried layer pattern 109a within the lower trench part 105a. Here, the first oxide layer 107 may be partially exposed externally.

Referring to FIG. 3F, the externally exposed portion of the first oxide layer 107 may be removed to externally expose a sidewall of the lower trench part 105a and an upper surface of the sacrificed buried layer pattern 109a.

Next, referring to FIG. 3G, the externally exposed sidewall of the lower trench part 105a and the surface of the epitaxial layer 101a of the semiconductor substrate 101 may be oxidized to form a second oxide layer 111. In this example, the second oxide layer 111 may be grown in a thermal oxidation manner. However, other methods of forming a second oxide layer 111 may be employed in other examples.

In this example, the thickness of the second oxide layer 111 may vary depending on the duration of time used to execute the oxidation. That is, the thickness of the second oxide layer 111 may be appropriately controlled by adjusting the oxidation time. In this example, as silicon (Si) of the semiconductor substrate 101 reacts with external oxygen ($O_2$) during the oxidation, the second oxide layer 111 may form on the surfaces of the lower trench part 105a and the semiconductor substrate 101.

Referring to FIG. 3H, the second oxide layer 111, the sacrificed buried layer pattern 109a and the first oxide layer 107a may be removed, so as to form a trench 105 that includes the lower trench part 105a and an upper trench part 105b having a width W2 wider than a width W1 of the lower trench part 105a. For instance, the width W2 of the upper trench part 105b may be appropriately controlled according to the thickness of the second oxide layer 111. That is, since the thickness of the second oxide layer 111 is changeable by appropriately controlling the oxidation time, the width W2 of the upper trench part 105b may be controlled by appropriately adjusting the oxidation time.

Referring to FIG. 3I, a gate insulating layer 113 may be formed on an entire surface of the epitaxial layer 101a of the semiconductor substrate 101 including the trench 105 that is provided with the lower trench part 105a and the upper trench part 105b. In this example, the gate insulating layer 113 may be implemented as a silicon oxide layer, and the gate insulating layer 113 may have a thickness of approximately 300 to 1000 Å.

Afterwards, as shown in FIG. 3J, a polysilicon layer 115 may be deposited on the gate insulating layer 113 within the trench 105 with sufficient thickness to fill up the trench 105. The polysilicon layer 115 may be doped with impurities. In an example, a P-type body region 101b may be formed within the semiconductor substrate 101 between adjacent trenches 105 through ion injection of P-type impurity such as boron into the epitaxial layer 101a of the semiconductor substrate 101 outside the trench 105. In this example, the P-type impurity may be ionically injected into the epitaxial layer 101a of the semiconductor substrate 101 without a separate mask.

Referring to FIG. 3K, the polysilicon layer 115 may be etched back with leaving only the lower trench part 105a, thereby forming a gate 115a.

Referring to FIG. 3L, N-type impurity such as arsenic or phosphorous may be injected into the surface of the epitaxial layer 101a of the semiconductor substrate 101 that contacts the upper trench part 105b, thereby forming a source region 117 within the surface of the body region 101b of the semiconductor substrate 101 that contacts the upper trench part 105b. For instance, the source region 117 may be formed within the semiconductor substrate 101 corresponding to the upper trench part 105b. The semiconductor substrate 101 may be used as a drain region.

Referring to FIG. 3M, an interlayer insulating layer 119 may be deposited on the gate 115a and the gate insulating layer 113. In this example, the interlayer insulating layer 119 may be made of an insulating material such as BPSG film, HLD oxide or combination thereof. However, in other examples, a different insulating material may be used to form the interlayer insulating layer 119.

Referring to FIG. 3N, the interlayer insulating layer 119 may be selectively removed through planarization, thereby forming an interlayer insulating layer pattern 119a within the trench 105.

Afterwards, in order to allow the body region 101b and the source region 117 of the semiconductor substrate 101 to contact each other, a contact trench may be formed using a self align contact (SAC) etching process and a highly doped P-type region 123 may then be formed through ion injection into a lower surface of the contact trench.

The contact trench may be filled up with a metal to form a metal layer 127. Accordingly, the fabricating process for the semiconductor device 100 according to the present disclosure may be completed. Here, the highly doped P-type region 123 may allow for Ohmic contact between the metal layer 127 and the body region 101b. Also, the metal layer 127 may be insulated from the gate 115a by the interlayer insulating layer pattern 119a that extends along an upper surface of each trench.

Hereinafter, description will be given of a method for fabricating a semiconductor device in accordance with another example with reference to FIGS. 4A to 4L.

FIGS. 4A to 4L are sectional views that sequentially illustrate another example of a method for fabricating a semiconductor device.

Figure 4A:
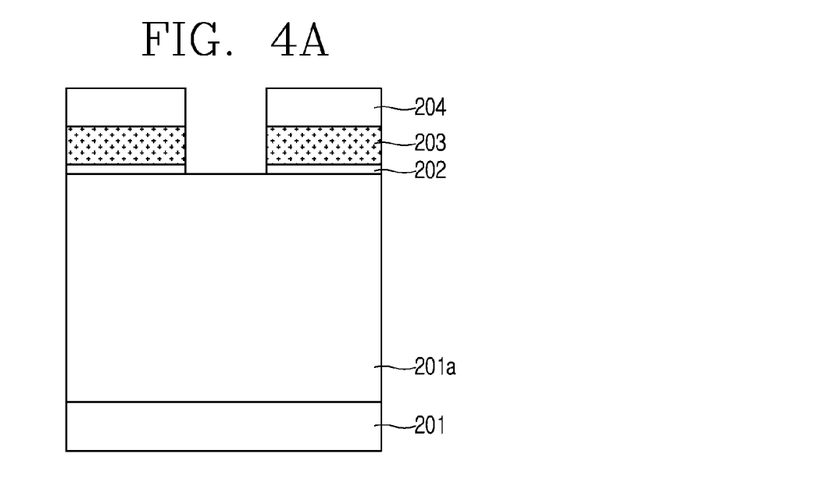
FIGS. 4A to 4L are diagrams of sectional views of a semiconductor device during its fabrication to illustrate another example of a method for fabricating the semiconductor device.

Referring to FIG. 4A, a lightly doped N-type epitaxial layer 201a may be dispersed on a highly doped N-type semiconductor substrate 201.

Although not shown, a pad oxide layer (not shown) and a pad silicon nitride layer (not shown) may be sequentially deposited on a semiconductor substrate 201 which is defined by an inactive layer region and an active region. Here, the pad oxide layer (not shown) and the pad silicon nitride layer (not shown) may be together used as a hard mask material layer. Also, a thickness of the hard mask material layer may be thinner than a depth of a deep trench. Therefore, the occurrence of a defective coating of a photosensitive layer may be suppressed or prevented.

Next, although not shown, a first photosensitive layer (not shown) may be coated on the pad silicon nitride layer (not shown).

The photosensitive layer (not shown) may be exposed and developed through a photolithography process using an exposure mask (not shown), and the developed portion may be removed, thereby forming a photosensitive layer pattern 204.

Still referring to FIG. 4A, the pad silicon nitride layer and the pad oxide layer that construct the hard mask may be etched using the photosensitive layer pattern 204 as a mask, to form a pad silicon nitride layer pattern 203 and a pad oxide layer pattern 202. Then, the first photosensitive layer pattern 204 may be removed. In this example, the etching is performed into the pad silicon nitride layer and the pad oxide layer to prevent the occurrence of a defective photosensitive layer coating, which may be caused when executing the etching for forming a shallow trench, namely, an upper trench part of the trench. That is, the formation of the pad silicon nitride layer pattern 203 and the pad oxide layer pattern 202 facilitates a process of defining a shallow trench forming region, namely, an upper trench part forming region, through the hard mask etching. Then, the shallow trench is formed by using the pad silicon nitride layer pattern 203 as a hard mask.

Figure 4B:
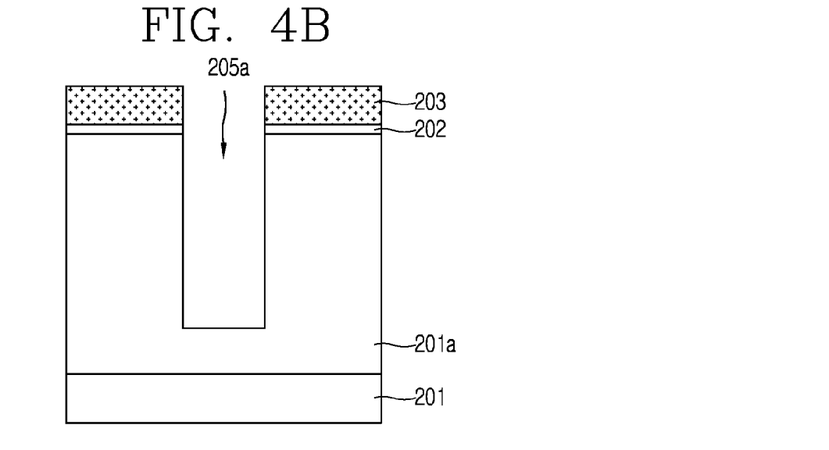

Referring to FIG. 4B, the pad silicon nitride layer pattern 203 and the pad oxide layer pattern 202 that form the hard mask may be used as an etching mask to etch an exposed portion of the epitaxial layer 201a of the semiconductor substrate 201 located beneath those patterns, thereby forming a lower trench part 205a corresponding to the deep trench.

Figure 4C:
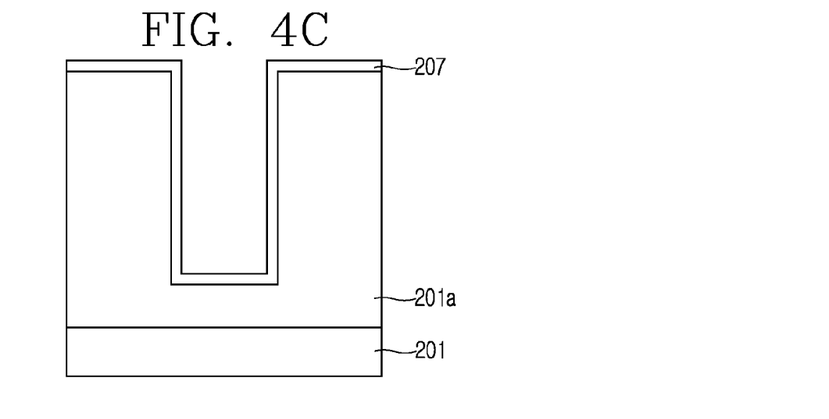

Next, referring to FIG. 4C, the pad silicon nitride layer pattern 203 and the pad oxide layer pattern 202 may be removed. Thereafter, the surface of the epitaxial layer 201a of the semiconductor substrate 201 including the lower trench part 105a may be oxidized to form a first oxide layer 207. In this example, instead of forming the first oxide layer 207, a sidewall nitride layer may be formed using a nitride layer. In the event that a sidewall nitride layer is formed, a sidewall oxide may be formed to reduce stress between the semiconductor substrate and a nitride layer material prior to forming the nitride layer. The first oxide layer 207 may be grown in a thermal oxidation manner.

The thickness of the first oxide layer 207 may vary depending on the duration of time used for executing the oxidation. That is, the thickness of the first oxide layer 207 may be appropriately controlled by adjusting the oxidation time.

Figure 4D:
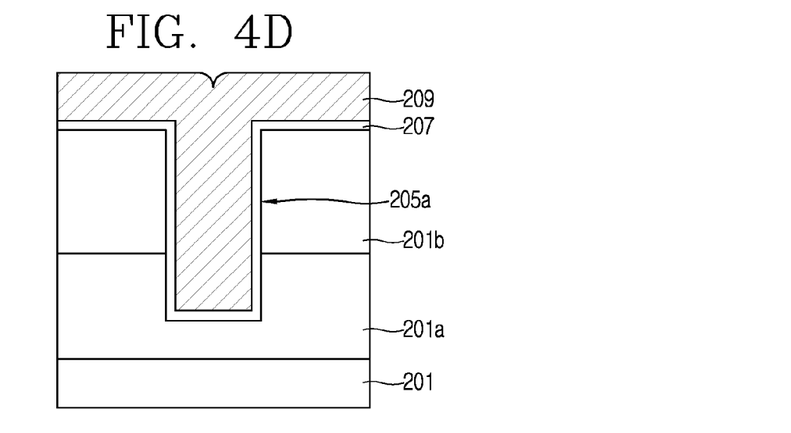

Referring to FIG. 4D, polysilicon may be deposited on the first oxide layer 207 located on the epitaxial layer 201a of the semiconductor substrate 201 including the lower trench part 205a, forming a polysilicon layer 209. In this example, the polysilicon layer 209 may be formed with sufficient thickness to fill up the inside of the lower trench part 205a. A P-type body region 201b may be formed within the semiconductor substrate 201 between adjacent trenches 205 through ion injection of P-type impurity such as boron into the epitaxial layer 201a of the semiconductor substrate 201 outside the trench 205. The P-type impurity may be ionically injected into the epitaxial layer 201a of the semiconductor substrate 201 without a separate mask.

Figure 4E:
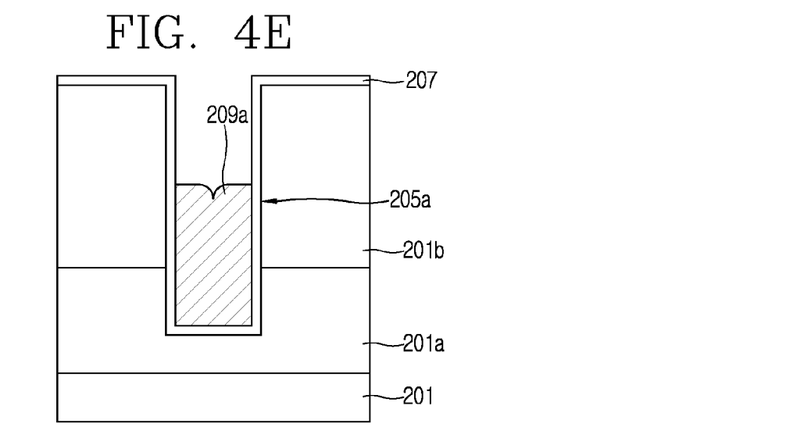

As shown in FIG. 4E, the polysilicon layer 109 may be etched back to form a gate 209a within the lower trench part 205a. The first oxide layer 209 may be partially exposed externally.

Figure 4F:
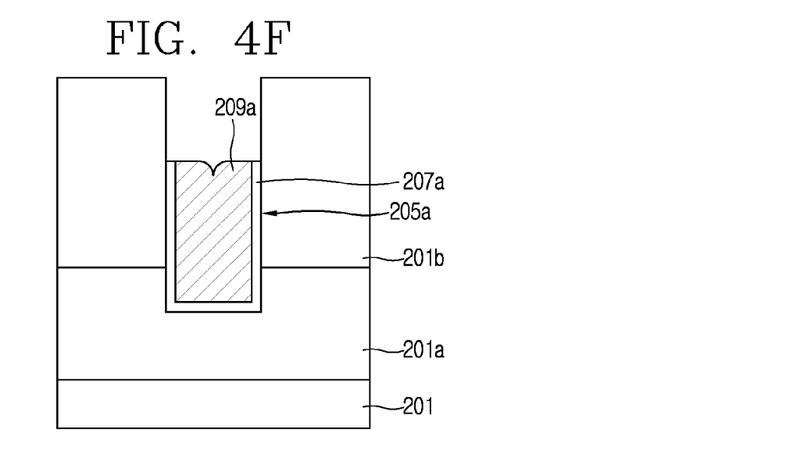

Referring to FIG. 4F, the externally exposed portion of the first oxide layer 209 may be removed to form a gate insulating layer 209a, and a sidewall of the is lower trench part 205a and an upper surface of the gate 209a may be exposed externally.

Figure 4G:
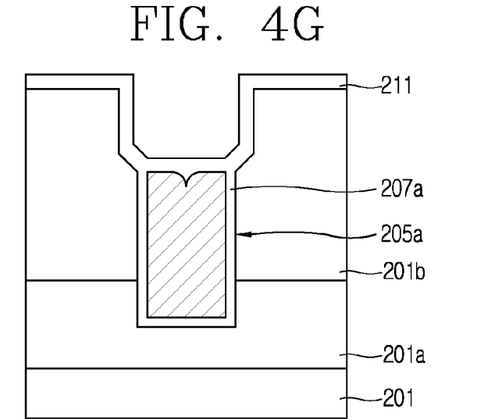

Referring to FIG. 4G, the externally exposed portion of the lower trench part 205a and the surface of the epitaxial layer 201a of the semiconductor substrate 201 may be oxidized to form a second oxide layer 211. In an example, instead of forming the second oxide layer, a sidewall nitride layer may be formed using a nitride layer. When a nitride layer is formed, a sidewall oxide may be formed to reduce stress between the semiconductor substrate and a nitride layer material prior to forming the nitride layer. The first oxide layer 211 may be grown in a thermal oxidation manner.

The thickness of the second oxide layer 211 may be changed depending on the duration of time use for executing the oxidation. That is, the thickness of the second oxide layer 211 may be appropriately controlled by adjusting the oxidation time. For example, during the oxidation, silicon (Si) of the semiconductor substrate 201 may react with external oxygen ($O_2$), and accordingly the second oxide layer 211 may be formed on the surfaces of the lower trench part 205a and the epitaxial layer 201a of the semiconductor substrate 201.

Figure 4H:
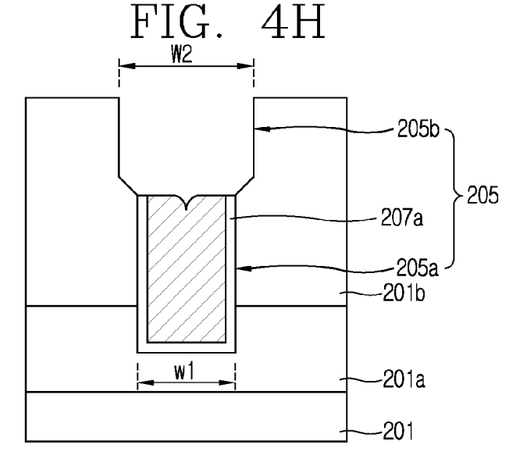

Referring to FIG. 4H, the second oxide layer 211 may be removed to form a trench 205 that includes the lower trench part 205a and an upper trench part 205b having a width W2 wider than a width W1 of the lower trench part 205a. In this example, the width W2 of the upper trench part 205b may be appropriately controlled according to the thickness of the second oxide layer 211. That is, since the thickness of the second oxide layer 211 may be changeable by appropriately controlling the oxidation time, the width W2 of the upper trench part 205b may be controlled by appropriately adjusting the oxidation time.

Figure 4I:
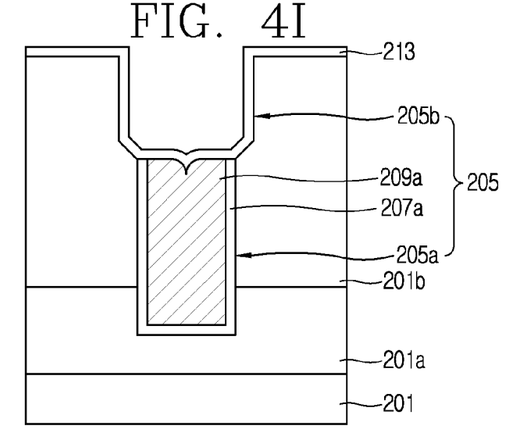

Referring to FIG. 4I, an insulating layer 213 may be formed on an entire surface of the semiconductor substrate 201 including the upper trench part 205b.

Figure 4J:
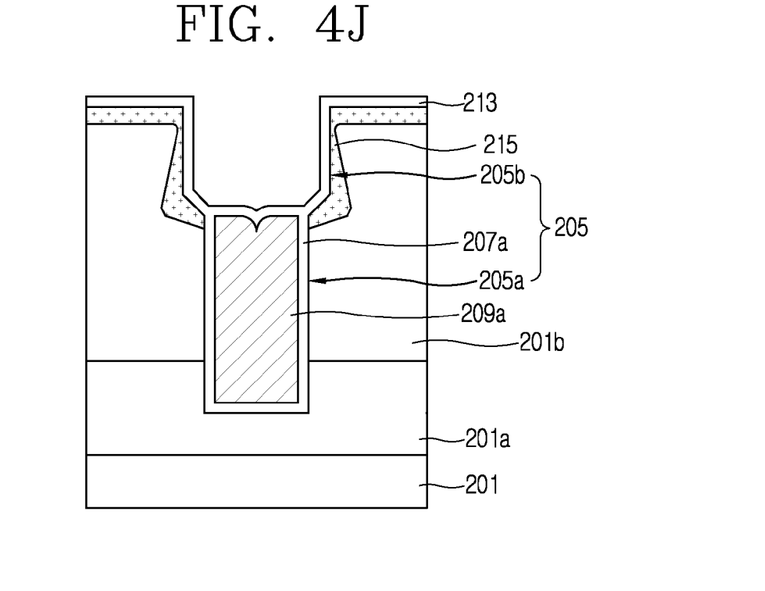

Referring to FIG. 4J, N-type impurity such as arsenic or phosphorous may be injected into the surface of the epitaxial layer 201a of the semiconductor substrate 201 that contacts the upper trench part 205b, thereby forming a source region 215 within the surface of the epitaxial layer 201a of the semiconductor substrate 201 that contacts the upper trench part 205b. For instance, the source region 215 may be formed within the epitaxial layer 201a of the semiconductor substrate 201 corresponding to the upper trench part 205b. The semiconductor substrate 201 may be used as a drain region.

Figure 4K:
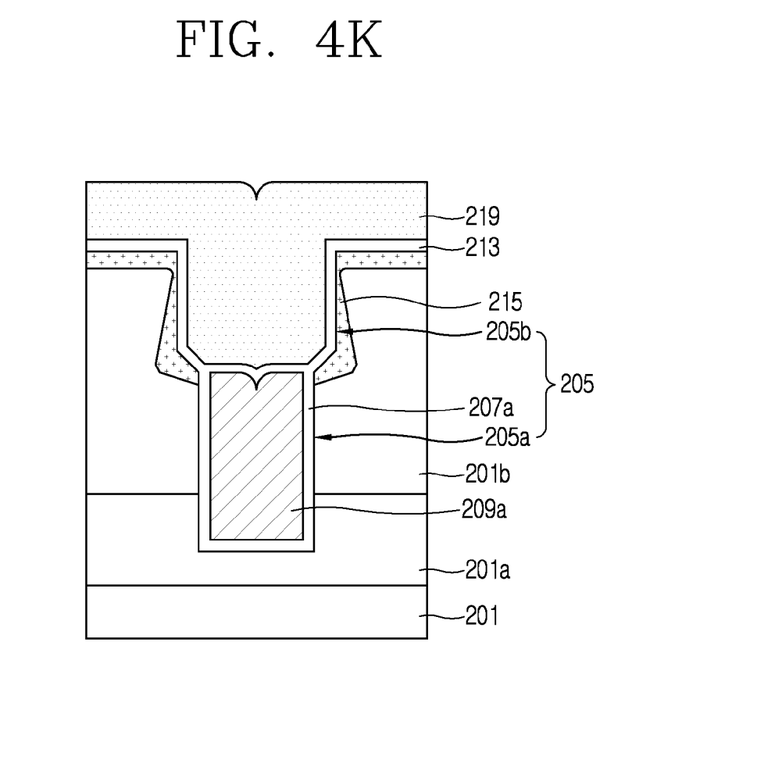

Referring to FIG. 4K, an interlayer insulating layer 219 may be deposited on the insulating layer 213 with sufficient thickness to fill up the upper trench part 205b. The interlayer insulating layer 219 may be made of an insulating material such as BPSG film, HLD oxide or combination thereof.

Figure 4L:
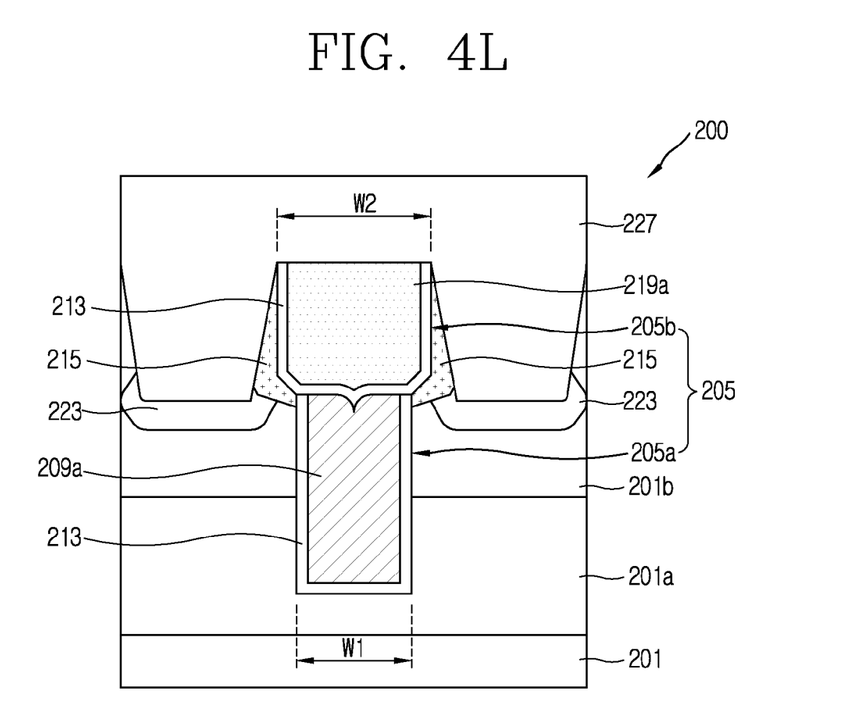

Referring to FIG. 4L, the interlayer insulating layer 219 may be selectively removed through planarization, thereby forming an interlayer insulating layer pattern 219a within the upper trench part 205b.

Afterwards, in order to allow the body region 201b with the source region 215 of the semiconductor substrate 201 to contact each other, a contact trench may be formed using a self align contact (SAC) etching process, and a highly doped P-type region 223 may then be formed through ion injection into a lower surface of the contact trench.

The contact trench may be filled up with a metal to form a metal layer 227. Accordingly, the fabricating process for the semiconductor device 200 according to the present disclosure may be completed. Here, the highly doped P-type region 223 may allow for Ohmic contact between the metal layer 227 and the body region 201b. Also, the metal layer 227 may be insulated from the gate 209a by the interlayer insulating layer pattern 219a which extends along an upper surface of each trench.

The source region 215 shown in FIG. 4J may be formed before removing the first oxide layer after forming the gate. Afterwards, the interlayer insulating layer pattern may be formed immediately without removing the second oxide layer. Also, the source region 215 may be formed directly through ion injection without removing the second oxide layer after forming the second oxide layer. Afterwards, the interlayer insulating layer pattern may be formed without removing the second oxide layer.

Figure 5:
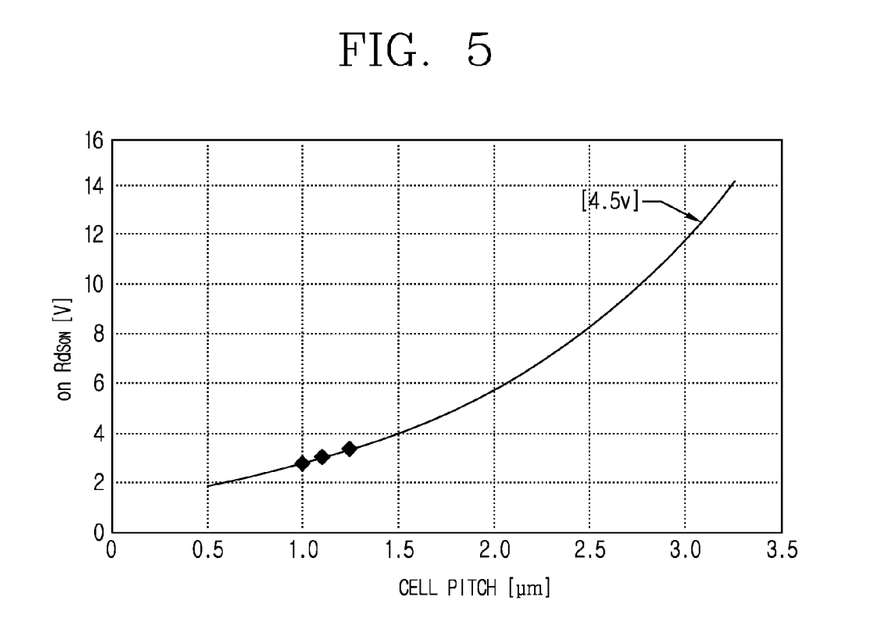
FIG. 5 is a graph showing a change in a resistance value in response to a cell pitch of an example of a semiconductor device according to the present disclosure.

FIG. 5 is a graph illustrating changes in resistance values in response to cell pitches of a semiconductor device according to the present disclosure.

As shown in FIG. 5, a curve graph includes a curve corresponding to a gate-source bias voltage of 4.5V.

It can be noticed that a cell pitch is reduced down to 1.0 μm in the semiconductor device according to the present disclosure.

Therefore, in the cell pitch according to the semiconductor device of the present disclosure, ON resistance $Rds_{on}$ according to the gate-source bias voltage may be reduced by approximately 20~30%.

As described above, the semiconductor device according to the present disclosure may have an upper trench part whose width is wider than a width of a lower trench part. This may increase the number of trenches formed per unit area, resulting in reduction of trench resistance of the semiconductor device.

As the semiconductor device according to the present disclosure has an is upper trench part whose width is wider than a width of a lower trench part, a source region may be ensured within the semiconductor device contacting the upper trench part. This may minimize a cell pitch (a trench-trench width) and increase a cell density accordingly. Consequently, an ON resistance value as one of main features of the semiconductor device using the trench may be lowered.

In accordance with various examples of a semiconductor device and a fabricating method thereof according to the present disclosure, after forming a lower trench part and then depositing a sacrificed buried layer implemented as a polysilicon layer or an interlayer insulating layer, a depth of a region where an upper trench part having a wide width is to be formed may be controlled through an etch-back process. Also, a width of the region where the upper trench part is to be formed can be increased through a self align contact oxidation. Accordingly, the width of the upper trench part can be effectively controlled according to the oxidation time, or by controlling a thickness of an oxide layer. This may minimize a cell pitch (trench-trench width), compared with other techniques, and increase a cell density accordingly. Consequently, a resistance value of the semiconductor device using the trench can be reduced.

Further, described herein are examples of semiconductor devices having a reduced cell pitch and low ON resistance, by forming an upper trench with a wide width and an interlayer insulating layer within the upper trench with the wide width, and thereafter forming a contact trench using the interlayer insulating layer as a mask.

In accordance with the present disclosure, there is provided a semiconductor device including a semiconductor substrate having an epitaxial layer, a trench formed within the epitaxial layer of the semiconductor substrate, the trench having an upper trench part wider than a lower trench part in width, a gate insulating layer formed on an inner surface of the trench, a gate formed on the gate insulating layer within the trench, an interlayer insulating layer pattern formed on the gate insulating layer within the trench including the gate, a source region formed within the semiconductor substrate, the source region contacting a sidewall of the upper trench part of the trench, a body region formed within the epitaxial layer of the semiconductor substrate, a contact trench filled up with a metal, the contact trench allowing the source region and the body region to contact each other, and a highly-doped impurity region formed beneath the contact trench, the highly-doped impurity region having the same type of impurity as the body region.

There is also provided a method for fabricating a semiconductor device including forming a lower trench part within a semiconductor device having an epitaxial layer, forming a first oxide layer on a surface of the lower trench part, forming a sacrificed buried layer pattern on the first oxide layer within the lower trench part, removing an exposed portion of the first oxide layer to expose a sidewall of the lower trench part, forming a second oxide layer on the sidewall of the lower trench part and a surface of the sacrificed buried layer pattern, removing the second oxide layer, the sacrificed buried layer pattern and the first oxide layer so as to form an upper trench part on the sidewall of the lower trench part, the upper trench part having a width wider than that of the lower trench part, forming a gate insulating layer on surfaces of the lower trench part, the upper trench part and the semiconductor substrate, filling up the trench by depositing polysilicon on the gate insulating layer within the lower trench part and the upper trench part, forming a body region within the epitaxial layer of the semiconductor substrate, forming a gate within the lower trench part by etching the polysilicon, forming a source region through ion injection into a sidewall of the upper trench part, forming an interlayer insulating layer pattern on the gate insulating layer within the upper trench part, forming a contact trench to contact the source region and the body region, forming a highly-doped impurity region on the contact trench, the highly-doped impurity region having the same type of impurity as the body region, and filling up the contact trench with a metal layer.

In accordance with another example of the present disclosure, there is provided a method for fabricating a semiconductor device including forming a lower trench part within a semiconductor substrate including an epitaxial layer, forming a first oxide layer on a surface of the lower trench part, depositing polysilicon on the first oxide layer within the lower trench part, forming a body region within the epitaxial layer of the semiconductor substrate, forming a gate within the lower trench part and partially exposing the first oxide layer, removing the exposed portion of the first oxide layer to expose a sidewall of the lower trench part, forming a second oxide layer on the gate and a sidewall of the lower trench part so as to form an upper trench part, the upper trench part having a width wider than that of the lower trench part, forming an insulating layer on the gate including the upper trench part, forming an interlayer insulating layer pattern on the insulating layer within the upper trench part, forming a contact trench to contact to the body region, forming a highly doped impurity region beneath the contact trench, the highly doped impurity region having the same type of impurity as the body region, and filling up the contact trench with a metal layer. Here, a source region may be formed before removing the first oxide layer after forming the gate, and thereafter the interlayer insulating layer pattern may be formed immediately without removing the second oxide layer. Also, the source region may be formed directly through ion injection without removing the second oxide layer after forming the second oxide layer, and thereafter the interlayer insulating layer pattern may be formed without removing the second oxide layer.

In accordance with various examples of a semiconductor device and a fabricating method thereof of the present disclosure, a source forming region may be ensured in advance by simultaneously forming a trench with a wide upper width when a trench is formed. Accordingly, there is no requirement of a trench-to-contact gap. This may result in minimizing a cell pitch and accordingly increasing the number of trenches within the same area.

With the minimization of the cell pitch (trench-trench width), a cell density may be improved. This may result in lowering a ON resistance value as one of main features of a semiconductor device using a trench.

In accordance with various examples of a semiconductor device and a fabricating method thereof according to the present disclosure, after forming a lower trench part and then depositing a sacrificed buried layer implemented as a polysilicon layer or an interlayer insulating layer, a depth of a region where an upper trench part having a wide width is to be formed may be controlled through an etch-back process. Also, a width of the region where the upper trench part is to be formed can increase through a self align contact oxidation. Accordingly, the width of the upper trench part can be effectively controlled according to the oxidation time, namely, a thickness of an oxide layer. This may minimize a cell pitch (trench-trench width), compared with the related art, and increase a cell density accordingly. Consequently, a resistance value of the semiconductor device using the trench can be reduced.

It is understood that the features of the present disclosure may be embodied in different forms and should not be constructed as limited to the examples set forth herein. Rather, examples are provided so that this disclosure will be thorough and complete, and will convey the full scope of the present disclosure to those skilled in the art. The drawings may not be necessarily to scale, and, in some instances, proportions may have been exaggerated in order to clearly illustrate features of the examples. When a first layer is referred to as being "on" a second layer or "on" a substrate, it may not only refer to a case where the first layer is formed directly on the second layer or the substrate but may also refer to a case where a third layer exists between the first layer and the second layer or the substrate. Further, while the expressions such as "first" or "second" can be used to refer to various elements, the elements are not limited by the expressions. The expressions are used only for the purpose of distinguishing one element from the other. An expression in singular form encompasses plural meaning, unless otherwise specified. Throughout the description, the expression "comprise" or "have" is used only to designate the existence of characteristic, number, step, operation, element, component or a combination thereof which are described herein, but not to preclude possibility of existence of one or more of the other characteristics, numbers, steps, operations, elements, components or combinations of these or addition.

The spatially-relative expressions such as "below", "beneath", "lower", "above", "upper", etc. may be used to conveniently describe relationships of one device or elements with other devices or among elements. The spatially-relative expressions should be understood as encompassing the direction illustrated in the drawings, added with other directions of the device in use or operation. Further, the device may be oriented to other directions and accordingly, the interpretation of the spatially-relative expressions is based on the orientation.

Further, the expression such as "first conductive type" and "second conductive type" as used herein may refer to the conductive types such as N or P types which are opposed to each other, and an example explained and exemplified herein encompasses complementary examples thereof.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A method for fabricating a semiconductor device comprising:
   to forming a lower trench part within an epitaxial layer of a substrate;
   forming a first oxide layer on a surface of the lower trench part;
   forming a sacrificed buried layer pattern on the first oxide layer within the lower trench part;
   removing an exposed portion of the first oxide layer to expose a sidewall is of the lower trench part;
   forming a second oxide layer on the sidewall of the lower trench part and a surface of the sacrificed buried layer pattern;
   removing the second oxide layer, the sacrificed buried layer pattern and the first oxide layer so as to form an upper trench part on the sidewall of the lower trench part, the upper trench part having a width wider than that of the lower trench part;
   forming a gate insulating layer on surfaces of the lower trench part, the upper trench part and the substrate;
   filling the trench by depositing polysilicon on the gate insulating layer within the lower trench part and the upper trench part;
   forming a body region within the epitaxial layer;
   forming a gate within the lower trench part by etching the polysilicon;
   forming a source region through ion injection into a sidewall of the upper trench part;
   forming an interlayer insulating layer pattern on the gate insulating layer within the upper trench part;
   forming a contact trench to contact the source region and the body region;
   forming a highly-doped impurity region on the contact trench, the highly-doped impurity region having the same type of impurity as the body region and to having a higher concentration of impurity than the body region; and
   filling the contact trench with a metal layer.

2. The method of claim 1, wherein the contact trench is formed using a self align contact etching method.

3. The method of claim 1, wherein the interlayer insulating layer comprises a BPSG film, HLD oxide or a combination thereof.

4. The method of claim 1, wherein the sacrificed buried layer pattern is made of polysilicon or an interlayer insulating material.

5. The method of claim 1, wherein the gate is formed by etching back the polysilicon.

6. A method for fabricating a semiconductor device comprising:
   forming a lower trench part within a substrate including an epitaxial layer;
   forming a first oxide layer on a surface of the lower trench part;
   depositing polysilicon on the first oxide layer within the lower trench part;
   forming a body region within the epitaxial layer;
   forming a gate within the lower trench part and partially exposing the first oxide layer;
   removing the exposed portion of the first oxide layer to expose a sidewall of the lower trench part;
   forming a second oxide layer on the gate and a sidewall of the lower to trench part so as to form an upper trench part, the upper trench part having a width wider than that of the lower trench part;
   forming an insulating layer on the gate including the upper trench part;
   forming an interlayer insulating layer pattern on the insulating layer within the upper trench part;
   is forming a contact trench to contact the body region;
   forming a highly doped impurity region beneath the contact trench, the highly doped impurity region having the same type of impurity as the body region and having a higher concentration of impurity than the body region; and
   filling the contact trench with a metal layer.

7. The method of claim 6, wherein the contact trench is formed using a self align contact etching method.

8. The method of claim 6, wherein the interlayer insulating layer comprises a BPSG film, HLD oxide or a combination thereof.

9. The method of claim 6, wherein the gate is formed by etching back the polysilicon.

10. The method of claim 6, further comprising forming a source region through ion injection before removing the first oxide layer after forming the gate.

11. The method of claim 6, further comprising forming a source region through ion injection after forming the second oxide layer on a sidewall of the to upper trench part.

12. The method of claim 6, further comprising forming a source region through ion injection after removing the second oxide layer.

13. The method of claim 10, wherein the contact trench is formed to contact the source region.

* * * * *